(12) United States Patent
Kouchi et al.

(10) Patent No.: US 10,373,757 B2
(45) Date of Patent: Aug. 6, 2019

(54) PRINTED CIRCUIT BOARD, ANTENNA, AND WIRELESS CHARGING DEVICE

(71) Applicant: SUMITOMO ELECTRIC PRINTED CIRCUITS, INC., Koka-shi, Shiga (JP)

(72) Inventors: Masahiko Kouchi, Shiga (JP); Tetsuya Shimomura, Shiga (JP)

(73) Assignee: SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 210 days.

(21) Appl. No.: 15/318,472

(22) PCT Filed: Jul. 1, 2015

(86) PCT No.: PCT/JP2015/068949
§ 371 (c)(1),
(2) Date: Dec. 13, 2016

(87) PCT Pub. No.: WO2016/006508
PCT Pub. Date: Jan. 14, 2016

(65) Prior Publication Data
US 2017/0133152 A1    May 11, 2017

(30) Foreign Application Priority Data

Jul. 7, 2014    (JP) .................... 2014-140045

(51) Int. Cl.
*H02J 7/00*        (2006.01)
*H01F 38/14*       (2006.01)
(Continued)

(52) U.S. Cl.
CPC ......... *H01F 38/14* (2013.01); *H01F 27/2804* (2013.01); *H02J 7/025* (2013.01);
(Continued)

(58) Field of Classification Search
USPC .......................................... 320/108
See application file for complete search history.

(56) References Cited

U.S. PATENT DOCUMENTS

2008/0297107 A1* 12/2008 Kato .................. H01F 27/2871
320/108

FOREIGN PATENT DOCUMENTS

| JP | S58-140104 A | 8/1983 |
| JP | H02-275606 A | 11/1990 |

(Continued)

*Primary Examiner* — Samuel Berhanu
(74) *Attorney, Agent, or Firm* — Drinker Biddle & Reath LLP (57) ABSTRACT

A printed circuit board according to an embodiment of the present invention includes, alternately, at least one insulating layer containing a synthetic resin as a main component; and a plurality of conductive layers including circuit patterns, wherein the plurality of circuit patterns of the plurality of conductive layers form a spiral pattern in plan view, and the plurality of circuit patterns are connected together via a plurality of through-holes so as to form a single closed loop in which a current flows counterclockwise or clockwise in an entirety of the spiral pattern. The conductive layers are preferably formed on both surfaces of the at least one insulating layer so as to form a pair. The spiral pattern includes a plurality of multi-row circuits arranged to form multi-rows, and a bridging circuit that connects an end portion of one multi-row circuit of one of the conductive layers to an end portion of another multi-row circuit of the other conductive layer, the other multi-row circuit being adjacent to the one multi-row circuit.

6 Claims, 3 Drawing Sheets

(51) Int. Cl.
*H02J 7/02* (2016.01)
*H05K 1/11* (2006.01)
*H05K 1/14* (2006.01)
*H01F 27/28* (2006.01)
*H05K 1/16* (2006.01)
*H02J 50/12* (2016.01)
*H01F 27/36* (2006.01)
*H05K 3/46* (2006.01)

(52) U.S. Cl.
CPC .............. *H02J 50/12* (2016.02); *H05K 1/115* (2013.01); *H05K 1/144* (2013.01); *H05K 1/148* (2013.01); *H05K 1/165* (2013.01); *H01F 27/365* (2013.01); *H01F 2027/2809* (2013.01); *H05K 3/4635* (2013.01); *H05K 2201/041* (2013.01); *H05K 2201/0959* (2013.01); *H05K 2201/09227* (2013.01); *H05K 2201/09536* (2013.01); *H05K 2201/10098* (2013.01)

(56) References Cited

FOREIGN PATENT DOCUMENTS

| | | |
|---|---|---|
| JP | H11-134459 A | 5/1999 |
| JP | H11-266545 A | 9/1999 |
| JP | 2009-277842 A | 11/2009 |
| JP | 2013-008859 A | 1/2013 |

* cited by examiner

FIG. 4

PRINTED CIRCUIT BOARD, ANTENNA, AND WIRELESS CHARGING DEVICE

TECHNICAL FIELD

The present invention relates to a printed circuit board, an antenna, and a wireless charging device.

BACKGROUND ART

In recent years, with the wide-spread use of items employing the Near Field Communication (NFC) technology such as the RFID (Radio Frequency IDentification) system and noncontact IC cards, devices using a coil circuit as an antenna are widely used. A known example of such a device is a wireless (noncontact) charging device employing the electromagnetic induction phenomenon. In this wireless charging device, a receiving antenna (secondary coil) is placed so as to face a transmitting antenna (primary coil), and a magnetic flux generated by passing a current through the transmitting antenna is used to generate a current in the receiving antenna. Such antennas are becoming common as charging devices for mobile devices (for example, refer to Patent Literature 1).

CITATION LIST

Patent Literature

PTL 1: Japanese Unexamined Patent Application Publication No. 11-266545

SUMMARY OF INVENTION

Technical Problem

Such an antenna for mobile devices is required to have a small size and enable efficient power transmission. However, a reduction in the size of an antenna is limited because, when the antenna is formed with a conventional enameled-wire coil, the thickness of the coil needs to be increased in order to increase the inductance per unit area. In addition, when the number of turns of the coil is simply increased, the potential difference between one end and the other end of the coil increases. This causes generation of a non-uniform magnetic field, resulting in a decrease in the efficiency of transmission and reception of electricity. Similarly, such problems may also occur in transformers using conventional enameled-wire coils.

Under the above-described circumstances, the present invention has been made. An object is to provide a printed circuit board, an antenna, and a wireless charging device that have small sizes and enable efficient transmission and reception of electricity.

Solution to Problem

A printed circuit board according to an embodiment of the present invention having been made to achieve the above-described object, includes, alternately, at least one insulating layer containing a synthetic resin as a main component; and a plurality of conductive layers including circuit patterns, wherein the plurality of circuit patterns of the plurality of conductive layers form a spiral pattern in plan view, and the plurality of circuit patterns are connected together via a plurality of through-holes so as to form a single closed loop in which a current flows counterclockwise or clockwise in an entirety of the spiral pattern.

An antenna according to another embodiment of the present invention having been made to achieve the above-described object, includes the printed circuit board.

A wireless charging device according to still another embodiment of the present invention having been made to achieve the above-described object, includes a transmitter and a receiver, wherein the transmitter and the receiver include the antenna.

Advantageous Effects of Invention

A printed circuit board, an antenna, and a wireless charging device according to the present invention have small sizes and enable efficient transmission and reception of electricity.

DESCRIPTION OF EMBODIMENTS

Description of Embodiments of the Present Invention

A printed circuit board according to an embodiment of the present invention includes, alternately, at least one insulating layer containing a synthetic resin as a main component; and a plurality of conductive layers including circuit patterns, wherein the plurality of circuit patterns of the plurality of conductive layers form a spiral pattern in plan view, and the plurality of circuit patterns are connected together via a plurality of through-holes so as to form a single closed loop in which a current flows counterclockwise or clockwise in an entirety of the spiral pattern.

The printed circuit board includes a stack alternately including one or more insulating layers and plural conductive layers including circuit patterns; and the circuit patterns constitute a single coil (spiral pattern circuit) that performs transmission or reception of electricity. Thus, the printed circuit board enables an increase in the number of turns of the coil and adjustment of inductance while an increase in the area and thickness of the coil is suppressed, to thereby increase the coupling coefficient and also achieve a reduction in the size. In addition, in the printed circuit board, plural circuit patterns constituting the coil are formed over plural conductive layers, and alternate connections via through-holes are established between the plural circuit patterns of the conductive layers to thereby decrease the potential difference between the conductive layers (potential difference in the coil axial direction). As a result, the printed circuit board enables suppression of variations in the magnetic field to thereby increase the electricity transmission-reception efficiency.

The conductive layers are preferably formed on both surfaces of the at least one insulating layer so as to form a pair. Conductive layers may be thus formed on both surfaces of a single insulating layer so as to form a pair, to thereby form a small-sized coil that enables efficient transmission and reception of electricity at low cost with ease and certainty.

The spiral pattern preferably includes a plurality of multi-row circuits arranged to form multi-rows and a bridging circuit. The multi-row circuits include a first multi-row circuit formed in a conductive layer on one of surfaces of the at least one insulating layer, and a second multi-row circuit formed in a conductive layer on another one of the surfaces of the at least one insulating layer and being adjacent to the first multi-row circuit, and the bridging circuit connects an end portion of the first multi-row circuit to an end portion of the second multi-row circuit. Plural multi-row circuits and a bridging circuit connecting together the multi-row circuits are thus formed on a pair of conductive layers, so that the spiral pattern can be efficiently formed, which further promotes a reduction in the size of the coil and an increase in the efficiency.

The plurality of multi-row circuits preferably have a length corresponding to less than one turn of the spiral pattern. The length of such a multi-row circuit is thus set so as to be in such a range, to thereby enable further suppression of variations in the magnetic field and a further increase in the electricity transmission-reception efficiency.

In 70% or more of a total length of the spiral pattern, a voltage difference between any one point of a circuit pattern of a conductive layer on one of surfaces of the at least one insulating layer and a point of a circuit pattern of a conductive layer on another one of the surfaces of the at least one insulating layer, the point being nearest to the one point, is preferably 50% or less of a voltage drop of the entirety of the spiral pattern. The voltage drop between the circuit patterns of a pair of conductive layers is thus set to such an upper limit or less, to thereby enable further suppression of variations in the magnetic field, and a further increase in the electricity transmission-reception efficiency.

In 70% or more of a total length of the spiral pattern, the plurality of circuit patterns of the plurality of conductive layers preferably partially overlap in plan view. Plural circuit patterns are thus formed so as to partially overlap in plan view, to thereby promote a reduction in the size of the coil and an increase in the electricity transmission-reception efficiency.

The at least one insulating layer preferably has flexibility. Such an insulating layer is thus formed so as to have flexibility, so that the coil can be disposed to form a curved surface, which facilitates incorporation of the coil into wearable terminals and the like.

The antenna according to another embodiment of the present invention includes the printed circuit board.

Since the antenna includes the printed circuit board, it enables a reduction in its size and also efficient transmission and reception of electricity.

A wireless charging device according to still another embodiment of the present invention includes a transmitter and a receiver, wherein the transmitter and the receiver include the antenna.

Since the wireless charging device includes a transmitter and a receiver each including the antenna, the device enables a reduction in its size and also has very high electricity transmission-reception efficiency.

Incidentally, the term "main component" denotes a component of the highest content, for example, a component accounting for 50 mass % or more of the material. The term "spiral" is not limited to truly spiral configurations, and is a concept that also encompasses a configuration in which plural circular arcs or plural polygonal portions are arranged so as to form multi-rows, and ends of outer circular arcs or polygonal portions are connected to ends of inner circular arcs or polygonal portions via straight lines or curved lines. The term "single closed loop" means a single continuous circuit that has no branch or breakpoint.

Details of Embodiments of the Present Invention

Hereinafter, a printed circuit board according to an embodiment of the present invention will be described in detail with reference to drawings. Incidentally, the meanings of "front and back" of the printed circuit board are as follows: in the thickness direction of the printed circuit board, a side on which a first conductive layer is formed is referred to as the front, while the other side opposite to the side on which the first conductive layer is formed is referred to as the back; and these front and back do not mean the front and back of the printed circuit board being used.

The printed circuit board in FIGS. 1, 2A, 2B, and 3 is, what is called, a flexible printed circuit board, which has flexibility. The printed circuit board includes a body part including, alternately, a single insulating layer containing a synthetic resin as the main component and two conductive layers including circuit patterns; and a jumper part disposed on the body part. Specifically, the printed circuit board includes, as the body part, a first insulating layer 1, a first conductive layer 2 formed on the front surface of the first insulating layer 1, and a second conductive layer 3 formed on the back surface of the first insulating layer 1. The printed circuit board further includes the jumper part including a second insulating layer 4 disposed on the back surface of the second conductive layer 3 and a third conductive layer 5 formed on the back surface side of the second insulating layer 4; a first coverlay 6 disposed on the front surface of the first conductive layer 2, and a second coverlay 7 disposed on the back surface of the third conductive layer 5. Incidentally, in FIGS. 2A and 2B, the first coverlay 6 is not shown for clarity.

<First Insulating Layer>

The first insulating layer 1 has flexibility and an electrical insulating property, and contains, as the main component, a synthetic resin for preventing a short circuit due to an electrical contact between the first conductive layer 2 and the second conductive layer 3. The first insulating layer 1 also serves as a base film (substrate) on which the first conductive layer 2 and the second conductive layer 3 are formed.

The material for the first insulating layer 1 is not particularly limited as long as it has flexibility and an insulating property. This material may be a low-dielectric-constant synthetic-resin film formed so as to have the shape of a sheet. Examples of the main component of this synthetic-resin film include polyimide, polyethylene terephthalate, liquid crystal polymers, and fluororesins.

The lower limit of the average thickness of the first insulating layer 1 is preferably 5 µm, more preferably 10 µm. The upper limit of the average thickness of the first insulating layer 1 is preferably 50 µm, more preferably 40 µm. When the average thickness of the first insulating layer 1 is less than the lower limit, the first insulating layer 1 may have an insufficient insulating strength. On the other hand, when the average thickness of the first insulating layer 1 is more than the upper limit, the printed circuit board may have an excessively large thickness.

<First Conductive Layer and Second Conductive Layer>

The first conductive layer 2 and the second conductive layer 3, which are formed of a conductive material, are formed on both surfaces of the first insulating layer 1 so as to form a pair. The first conductive layer 2 has a first circuit pattern 2a. The second conductive layer 3 has a second circuit pattern 3a.

The material for the first conductive layer 2 and the second conductive layer 3 is not particularly limited as long as it has conductivity. This material preferably has a low electric resistance. For example, the first conductive layer 2 and the second conductive layer 3 may be formed of copper, silver, platinum, or nickel. The surfaces of the first conductive layer 2 and the second conductive layer 3 may be plated with, for example, gold, silver, tin, or nickel. Alternatively, the conductive layers may be formed by printing with, for example, a paste or ink containing a metal such as copper, silver, or nickel.

The lower limit of the average thickness of the first conductive layer 2 and the second conductive layer 3 is preferably 0.1 µm, more preferably 1 µm. The upper limit of the average thickness of the first conductive layer 2 and the second conductive layer 3 is preferably 100 µm, more preferably 80 µm. When the average thickness of the first conductive layer 2 and the second conductive layer 3 is less than the lower limit, the internal resistance may become high, which results in excessively high loss, and the strength may become insufficient, which increases the probability of breakage of the first conductive layer 2 and the second conductive layer 3. When the average thickness of the first conductive layer 2 and the second conductive layer 3 is more than the upper limit, the printed circuit board may have an excessively large thickness or may have insufficient flexibility.

The first circuit pattern 2a of the first conductive layer 2 and the second circuit pattern 3a of the second conductive layer 3 are provided to form a spiral pattern S in plan view. These circuit patterns 2a and 3a are electrically connected together via plural loop-forming through-holes 8 to form a single closed loop in which a current flows counterclockwise or clockwise in the entirety of the spiral pattern S.

The spiral pattern S includes plural multi-row circuits arranged so as to form multi-rows, and a bridging circuit connecting together an end portion of one multi-row circuit in one of the first conductive layer 2 and the second conductive layer 3 forming the pair and an end portion of a multi-row circuit (adjacent to the one multi-row circuit) of the other conductive layer. Specifically, the multi-row circuits are partial circular (circular arc) circuits that have different radii and are concentrically arranged so as to form multi-rows. Specifically, the bridging circuit connects together an end portion of one multi-row circuit and an end portion of a multi-row circuit that is adjacent to the one multi-row circuit in plan view. Incidentally, the pattern in FIG. 2A includes, alternately, bridging circuits that are the loop-forming through-holes 8 themselves and bridging circuits constituted by a circuit extending from an end portion of a multi-row circuit of the first conductive layer 2 and connecting to a loop-forming through-hole 8 and a circuit extending from this loop-forming through-hole 8 and connecting to an end portion of a multi-row circuit of the second conductive layer 3.

More specifically, the spiral pattern S includes a first multi-row circuit group having the configuration of plural concentric circular arcs within the first circuit pattern 2a; a second multi-row circuit group having the configuration of plural concentric circular arcs, within the second circuit pattern 3a, arranged between the multi-row circuits of the first multi-row circuit group in plan view; and plural bridging circuits constituted by portions of the first circuit pattern 2a and second circuit pattern 3a, and connecting together the first multi-row circuit group and the second multi-row circuit group. Regarding the multi-row circuits of the first multi-row circuit group and the second multi-row circuit group, except for the outermost and innermost multi-row circuits, both end portions of each multi-row circuit are connected to bridging circuits. As a result, the spiral pattern S forms a single closed loop in which plural multi-row circuits are connected together so as to have a substantially spiral configuration, and a current flows counterclockwise or clockwise in the entirety of the pattern. Among the bridging circuits, portions extending from end portions of multi-row circuits and connecting to the loop-forming through-holes 8 are formed from the outer circumference toward inner circumference of the spiral pattern S. Incidentally, the bridging direction of a bridging circuit in plan view (connection direction of a multi-row circuit) is not particularly limited, and may be, for example, the radial direction of the circular arc of the multi-row circuit.

The multi-row circuits of the first multi-row circuit group and the second multi-row circuit group overlap in plan view. Since the ratio of the bridging circuits to the total length of the spiral pattern S is low, the circuit patterns of the first conductive layer 2 and the second conductive layer 3 overlap in plan view in 70% or more of the total length of the spiral pattern S. Incidentally, such a range in which the circuit patterns of the first conductive layer 2 and the second conductive layer 3 overlap in plan view is preferably 80% or more of the total length of the spiral pattern S, more preferably 90% or more. Such a configuration is provided such that the projected region of the multi-row circuits of the first circuit pattern 2a contains the projected region of the multi-row circuits of the second circuit pattern 3a, to thereby increase the coupling coefficient of the coil.

Figure 1:
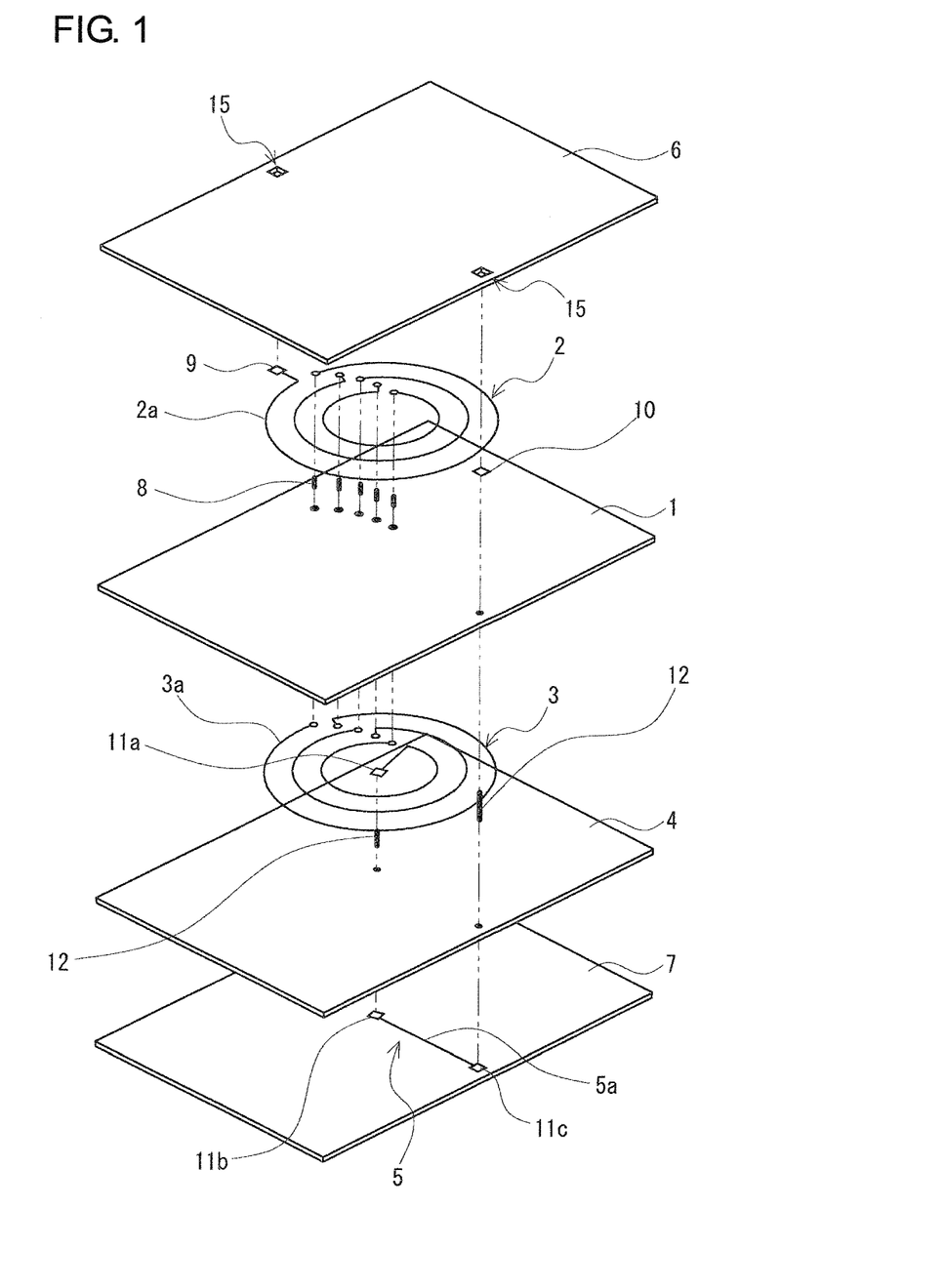
FIG. 1 is a schematic exploded perspective view of a printed circuit board according to an embodiment of the present invention.
Figure 2A:
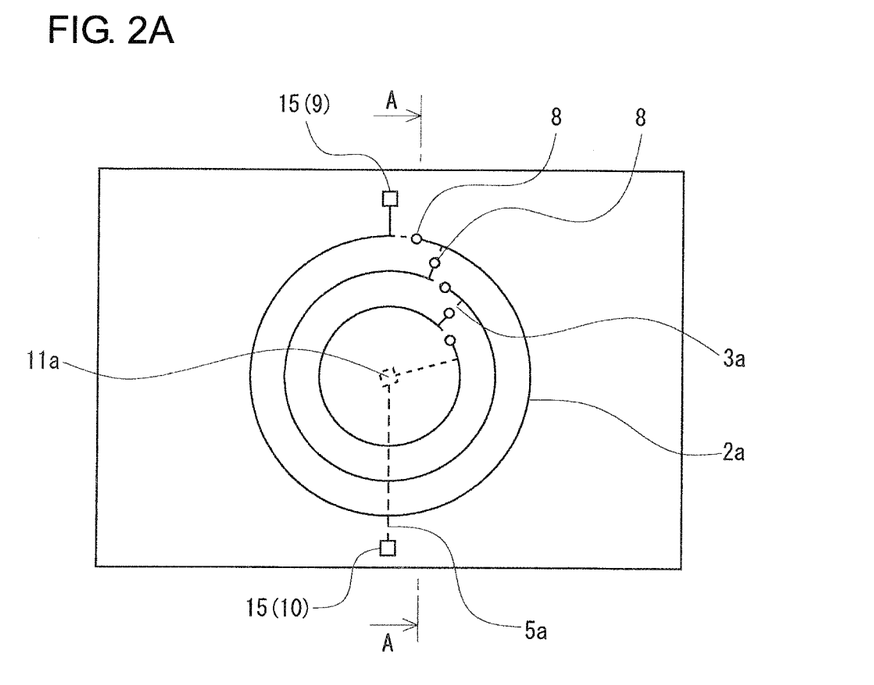
FIG. 2A is a schematic plan view of the printed circuit board in FIG. 1.
Figure 2B:
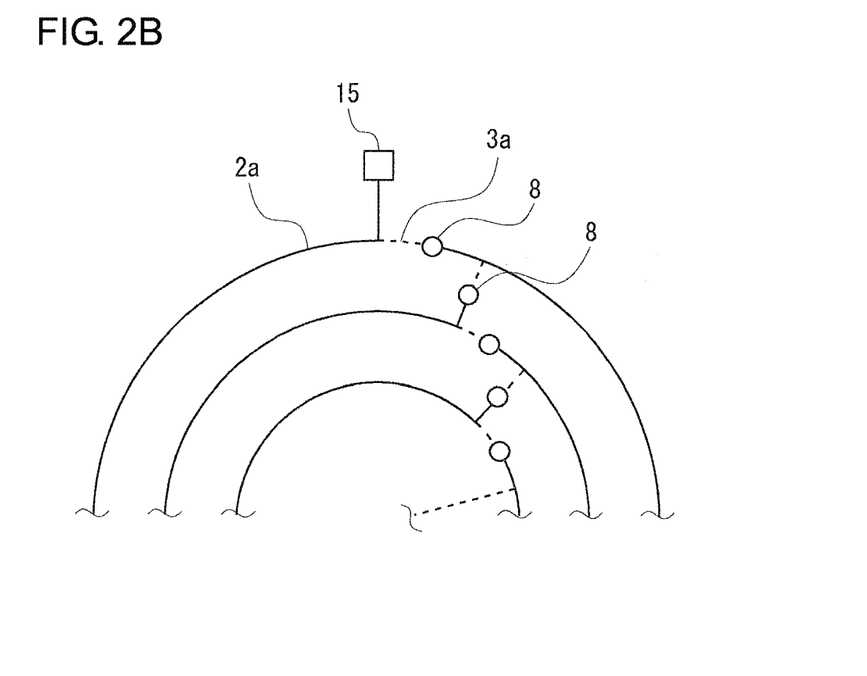
FIG. 2B is a partial enlarged view of FIG. 2A.
Figure 3:
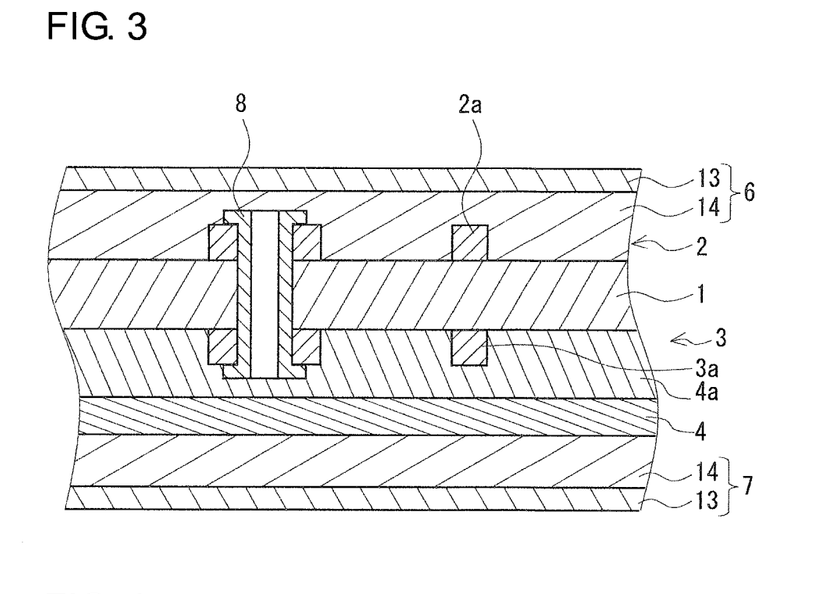
FIG. 3 is a schematic partial sectional view taken along line A-A in FIG. 2A.

As illustrated in FIG. 1, the first conductive layer 2 includes a first connection terminal 9 connected to one end portion (end portion not connected to any bridging circuit) of the outermost multi-row circuit of the first circuit pattern 2a, and a second connection terminal 10 electrically connected via a terminal-connecting through-hole 12 to a third intermediate terminal 11c of a third conductive layer 5 described later. The first connection terminal 9 and the second connection terminal 10 constitute a pair of connection terminals of the spiral pattern S. The second conductive layer 3 includes a first intermediate terminal 11a connected to one end portion (end portion not connected to any bridging circuit) of the innermost multi-row circuit of the second circuit pattern 3a. The first intermediate terminal 11a is electrically connected via a terminal-connecting through-hole 12 to a second intermediate terminal 11b of the third conductive layer 5 described later.

The lower limit of the average width of the multi-row circuits and bridging circuits (except for the loop-forming through-holes 8) of the first circuit pattern 2a and the second circuit pattern 3a is preferably 0.03 mm, more preferably 0.2 mm. The upper limit of the average width of the multi-row circuits and bridging circuits is preferably 1.5 mm, more preferably 1.25 mm. When the average width of the multi-row circuits and bridging circuits is less than the lower limit, the multi-row circuits and bridging circuits may have insufficient mechanical strength and may break. On the other hand, when the average width of the multi-row circuits and bridging circuits is more than the upper limit, the printed circuit board may have an excessively large size. Incidentally, in this embodiment, the multi-row circuits and bridging circuits except for the loop-forming through-holes 8 preferably have a constant width.

The average gap width (insulation distance) of the multi-row circuits in plan view, in other words, the average gap width of circular arc portions (loops) constituting the spiral pattern S is not particularly limited, and may be, for example, 0.02 mm or more and 4.5 mm or less.

The number of turns of the spiral pattern S (the entirety of the multi-row circuits of the first circuit pattern 2a and the multi-row circuits of the second circuit pattern 3a) is appropriately designed in accordance with, for example, the intended use of the printed circuit board and the target inductance, and is, for example, 2 or more and 500 or less.

The plural multi-row circuits preferably have a length corresponding to 0.05 turns or more and less than 1 turn of the spiral pattern S. When the multi-row circuits have a length equal to or more than the upper limit, the effect of decreasing the potential difference between the conductive layers may not be sufficiently provided. Conversely, when the multi-row circuits have a length less than the lower limit, which results in an increase in the number of the through-holes, adjustment of inductance and resistance of the spiral pattern S may become difficult to perform, and the printed circuit board may have an excessively large size.

In 70% or more of the total length of the spiral pattern, the voltage difference between any one point of the circuit pattern of one of the conductive layers and a point of the circuit pattern of the other conductive layer, the point being nearest to the one point, is preferably 50% or less of the voltage drop of the entirety of the spiral pattern. The upper limit of the voltage difference is more preferably 35% of the voltage drop of the entirety of the spiral pattern S, still more preferably 20%. The range in which the voltage difference is the upper limit or less is more preferably 80% or more of the total length of the spiral pattern, still more preferably 90% or more. When the voltage difference is more than the upper limit, variations in the magnetic field increase, and an increase in the electricity transmission-reception efficiency of the printed circuit board may not be sufficiently achieved.

<Loop-Forming Through-Holes>

The loop-forming through-holes 8 extend through the first conductive layer 2, the first insulating layer 1, and the second conductive layer 3 to electrically connect the first circuit pattern 2a to the second circuit pattern 3a. The loop-forming through-holes 8 can be formed by forming through-holes in a laminated body having a stack of the above-described layers, and plating the through-holes with a metal such as copper, or injecting, for example, silver paste or copper paste into the through-holes and curing the paste by heating. The average diameter of the loop-forming through-holes 8 is appropriately selected in accordance with, for example, workability and continuity characteristics, and may be, for example, 20 μm or more and 2000 μm or less.

<Second Insulating Layer>

The second insulating layer 4 and the third conductive layer 5 formed on the back surface of the second insulating layer 4 constitute the jumper part of the spiral pattern S. The second insulating layer 4 has flexibility and an electrical insulating property, and contains, as the main component, a synthetic resin for preventing a short circuit due to an electrical contact between the second conductive layer 3 and the third conductive layer 5.

The second insulating layer 4 has, on its front surface, an adhesive layer 4a. The second insulating layer 4 is disposed, with this adhesive layer 4a being interposed, on the back surfaces of the first insulating layer 1 and second conductive layer 3.

The synthetic resin used for the second insulating layer 4 may be the same as that for the first insulating layer 1. The average thickness of the second insulating layer 4 may be the same as that of the first conductive layer 2. The material and average thickness of the adhesive layer 4a of the second insulating layer 4 may be the same as those of adhesive layers 14 of the first coverlay 6 and the second coverlay 7 described later.

<Third Conductive Layer>

The third conductive layer 5 is formed of a conductive material, and is disposed on the back surface of the second insulating layer 4. This third conductive layer 5 has a connection wiring pattern 5a.

The material for the third conductive layer 5 may be the same as that for the first conductive layer 2 and the second conductive layer 3. The average thickness of the third conductive layer 5 may be the same as that of the first conductive layer 2 and the second conductive layer 3.

The connection wiring pattern 5a is a linear wiring that connects the first intermediate terminal 11a of the second conductive layer 3 to the second connection terminal 10 of the first conductive layer 2. The third conductive layer 5 has the second intermediate terminal 11b at one end of the connection wiring pattern 5a, the one end overlapping the first intermediate terminal 11a in plan view, and has the third intermediate terminal 11c at the other end of the connection wiring pattern 5a, the other end overlapping the second connection terminal 10 in plan view.

The first intermediate terminal 11a is electrically connected to the second intermediate terminal 11b, and the second connection terminal 10 is electrically connected to the third intermediate terminal 11c, via the terminal-connecting through-holes 12.

<Terminal-Connecting Through-Holes>

As described above, the terminal-connecting through-holes 12 extend through the insulating layers and conductive layers as needed, to establish electrical connections between the intermediate terminals and between the connection terminals. The terminal-connecting through-holes 12 are formed in the same manner as in the loop-forming through-holes 8. The average diameter of the terminal-connecting through-holes 12 may be the same as that of the loop-forming through-holes 8.

<Coverlays>

The first coverlay 6 and the second coverlay 7 in the printed circuit board mainly protect the first conductive layer 2 and the third conductive layer 5. These first coverlay 6 and second coverlay 7 each have a covering film 13 and an adhesive layer 14. The first coverlay 6 has two openings 15 for enabling access to the first connection terminal 9 and the second connection terminal 10.

(Covering Films)

The covering films 13 have flexibility and an insulating property. Examples of the main component of the covering films 13 include polyimide, epoxy resins, phenolic resins, acrylic resins, polyester, thermoplastic polyimide, polyethylene terephthalate, fluororesins, and liquid crystal polymers. Of these, polyimide is preferred from the viewpoint of heat resistance. The covering films 13 preferably contain a high-dielectric-constant material as the main component. The covering films 13 may contain, for example, a resin other than the main component, a weather resistance agent, or an antistatic agent.

The lower limit of the average thickness of the covering films 13 is not particularly limited, and is preferably 3 µm, more preferably 10 µm. The upper limit of the average thickness of the covering films 13 is not particularly limited, and is preferably 500 µm, more preferably 150 µm. When the average thickness of the covering films 13 is less than the lower limit, protection for the first conductive layer 2, the third conductive layer 5, and the like may become insufficient, and, in the case of forming the covering films 13 so as to have an insulating property, a sufficient insulating property may not be provided. On the other hand, when the average thickness of the covering films 13 is more than the upper limit, the incremental protection effect for the first conductive layer 2, the third conductive layer 5, and the like may be weak, and the covering films 13 may have insufficient flexibility.

(Adhesive Layers)

The adhesive forming the adhesive layers 14 is not particularly limited, and is preferably an adhesive having high plasticity and high heat resistance. Examples of such an adhesive include various resin adhesives such as epoxy resins, polyimide, polyester, phenolic resins, polyurethane, acrylic resins, melamine resins, and polyamide-imide.

The lower limit of the average thickness of the adhesive layers 14 is preferably 5 µm, more preferably 10 µm. The upper limit of the average thickness of the adhesive layers 14 is preferably 50 µm, more preferably 40 µm. When the average thickness of the adhesive layers 14 is less than the lower limit, the first coverlay 6 and the second coverlay 7 may have insufficient bonding strengths to the first conductive layer 2, the first insulating layer 1, the third conductive layer 5, the second insulating layer 4, and the like. On the other hand, when the average thickness of the adhesive layers 14 is more than the upper limit, the printed circuit board may have an excessively large thickness, and may have insufficient flexibility.

<Production Method>

The printed circuit board can be produced with ease and certainty by, for example, a production method including a conductive layer formation step, a first through-hole formation step, a jumper part placement step, a second through-hole formation step, and a coverlay placement step.

(Conductive Layer Formation Step)

In the conductive layer formation step, a conductive material is placed on both surfaces of the first insulating layer 1 to form the first conductive layer 2 and the second conductive layer 3; and a conductive material is placed on the back surface of the second insulating layer 4 to form the third conductive layer 5. The planar configurations of the first circuit pattern 2a, the first connection terminal 9, and the second connection terminal 10 of the first conductive layer 2, the second circuit pattern 3a and the first intermediate terminal 11a of the second conductive layer 3, and the connection wiring pattern 5a, the second intermediate terminal 11b, and the third intermediate terminal 11c of the third conductive layer 5 can be formed by appropriate processes in accordance with, for example, the processes of forming layers of the conductive materials. For example, metal films formed on insulating layers may be masked and etched to thereby form the patterns. Such a metal film may be formed by, for example, bonding of a metal foil or the like to an insulating layer with an adhesive or the like, or vapor deposition of a metal on an insulating layer. Alternatively, when the conductive layers are formed from conductive pastes, a printing technique may be employed to form the circuit patterns and terminals.

(First Through-Hole Formation Step)

In the first through-hole formation step, the loop-forming through-holes 8 are formed so as to extend through the first insulating layer 1, the first conductive layer 2, and the second conductive layer 3. The loop-forming through-holes 8 can be formed by forming through-holes so as to extend through the first insulating layer 1, the first conductive layer 2, and the second conductive layer 3, and plating the through-holes with a metal such as copper, or injecting, for example, silver paste or copper paste into the through-holes and curing the paste by heating. The through-holes can be formed by, for example, an etching process, a laser processing, or a punching process. In addition, for the purpose of reinforcement, the spaces within the loop-forming through-holes 8 may be filled with a resin, for example.

(Jumper Part Placement Step)

In the jumper part placement step, the second insulating layer 4 having the third conductive layer 5 on its back surface is placed on, with the adhesive layer 4a being interposed, the back surface of the second conductive layer 3 of the laminated body including the first insulating layer 1, the first conductive layer 2, and the second conductive layer 3 having the loop-forming through-holes 8. At this time, the position of placement is adjusted such that the second intermediate terminal 11b and the first intermediate terminal 11a overlap in plan view, and the third intermediate terminal 11c and the second connection terminal 10 overlap in plan view.

(Second Through-Hole Formation Step)

In the second through-hole formation step, the terminal-connecting through-holes 12 are formed so as to extend through, as needed, the first insulating layer 1, the first conductive layer 2, and the second conductive layer 3, and the second insulating layer 4, and the third conductive layer 5. The terminal-connecting through-holes 12 can be formed in the same manner as that for the loop-forming through-holes 8 described above.

(Coverlay Placement Step)

In the coverlay placement step, the first coverlay 6 is placed on the front surface of the first conductive layer 2, and the second coverlay 7 is placed on the back surface of the third conductive layer 5. Specifically, the first coverlay 6 and the second coverlay 7 can be formed by bonding the covering films 13, via the adhesive layers 14, to the first insulating layer 1 and first conductive layer 2, and the second insulating layer 4 and third conductive layer 5.

Advantages

In the printed circuit board, a single first insulating layer 1 and plural conductive layers 2 and 3 having circuit patterns 2a and 3a are alternately stacked; the circuit patterns 2a and 3a constitute a single coil (spiral pattern circuit) that performs transmission or reception of electricity. Thus, the printed circuit board enables an increase in the number of turns of the coil and adjustment of inductance while an increase in the area and thickness of the coil is suppressed. This enables an increase in the coupling coefficient and a reduction in the size. In addition, in the printed circuit board, plural circuit patterns 2a and 3a constituting the coil are formed over plural conductive layers 2 and 3; and alternate connections are established between the circuit patterns 2a and 3a of the conductive layers 2 and 3 through the loop-forming through-holes 8, to thereby decrease the potential difference (potential difference in the axial direction of the coil) between the conductive layers. As a result, the printed circuit board enables suppression of variations in the magnetic field to increase the electricity transmission-reception efficiency.

In the printed circuit board, conductive layers 2 and 3 are formed on both surfaces of a single first insulating layer 1 so as to form a pair; and plural multi-row circuits and bridging circuits are formed in the conductive layers 2 and 3. Thus, the spiral pattern S can be efficiently formed of a small number of members, which further promotes a reduction in the size of the coil and an increase in the efficiency.

<Antenna>

Because of the above-described advantages of the printed circuit board, an antenna including the printed circuit board facilitates a reduction in the size and enables efficient transmission and reception of electricity. Therefore, the antenna is suitably applicable to wireless receiving antennas and communication antennas for mobile devices and the like.

Incidentally, in addition to the above-described antenna, the printed circuit board is also applicable to transformers.

<Wireless Charging Device>

In a wireless charging device including a transmitter and a receiver, the transmitter and the receiver including the above-described antenna, the transmitter and the receiver individually exhibit high electricity transmission-reception efficiency. As a result, the wireless charging device exhibits very high electricity transmission-reception efficiency. In addition, the wireless charging device enables a reduction in the size of each of the transmitter and the receiver.

Other Embodiments

The embodiments disclosed herein should be understood as examples in all respects and not being restrictive. The scope of the present invention is not limited to the configurations of the above-described embodiments but is indicated by Claims. The scope of the present invention is intended to embrace all the modifications within the meaning and range of equivalency of the Claims.

Figure 4:
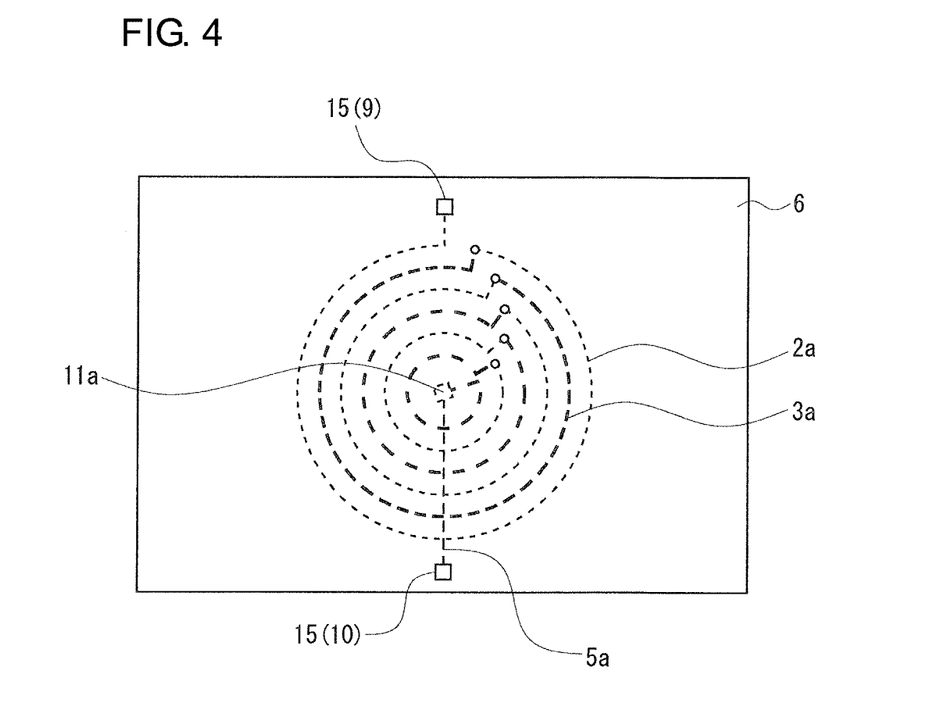
FIG. 4 is a schematic plan view of a printed circuit board according to an embodiment other than that in FIG. 2A.

The above-described embodiment employs a configuration in which the first circuit pattern of the first conductive layer and the second circuit pattern of the second conductive layer overlap in plan view in 70% or more of the total length of the spiral pattern. Alternatively, as illustrated in FIG. 4, a printed circuit board may include a first circuit pattern 2a and a second circuit pattern 3a that do not overlap in plan view. In this case, for example, one ends of multi-row circuits of one of the circuit patterns are directly connected to loop-forming through-holes 8; and multi-row circuits of the other circuit pattern are connected via bridging circuits to the loop-forming through-holes 8 on the other-circuit-pattern side, so that the first circuit pattern 2a and the second circuit pattern 3a constitute a single closed loop.

The above-described embodiment employs a spiral pattern that is constituted by plural circular-arc multi-row circuits and has an outer shape of a circular shape. Alternatively, the spiral pattern may have a polygonal outer shape. In this case, plural multi-row circuits have partial shapes of plural similar polygons having the same center of gravity.

In the above-described embodiment, conductive layers including circuit patterns are formed on both surfaces of a single insulating layer so as to form a pair, and these circuit patterns of the conductive layers are used to form a spiral pattern. Alternatively, in such a printed circuit board, two or more insulating layers and three or more conductive layers may be alternately stacked, and three or more circuit patterns may be used to form a spiral pattern. In this case, loop-forming through-holes are used to establish sequential connections of multi-row circuits among the conductive layers such that the multi-row circuits of the conductive layers form a closed loop. In this way, two or more insulating layers and three or more conductive layers are used to form a spiral pattern, to thereby further reduce variations in the magnetic field and further promote enhancement of the electricity transmission-reception efficiency. Incidentally, the through-holes connecting together plural circuit patterns may be blind via holes.

The printed circuit board may be formed by stacking plural insulating layers each having, on a single surface alone, a conductive layer.

In the printed circuit board, the spiral pattern may have no bridging circuit and have a planar configuration in which plural multi-row circuits smoothly and continuously extend.

In the printed circuit board, the jumper part electrically connecting the innermost intermediate terminal of the spiral pattern to an outer connection terminal of the spiral pattern is not limited to the above-described configuration of having an insulating layer and a conductive layer. For example, the innermost intermediate terminal may be connected to an outer connection terminal via a lead and solder that provide a connection going around the insulating layer. Incidentally, the conductive layers forming the pair of connection terminals (the first connection terminal and the second connection terminal in the above-described embodiment) of the spiral pattern, and the planar positions of the conductive layers may be freely selected.

The printed circuit board may further include magnetic sheets on the outer surface sides of the outermost insulating layers. The magnetic sheets are thus disposed on the outer surface sides of the insulating layers, to thereby block a magnetic flux generated by the spiral pattern to prevent the magnetic flux from affecting the surrounding circuits. In particular, magnetic sheets having a relative magnetic permeability of 80 or more may be used, to increase the inductance per unit area, which enables a further reduction in the size. Such a magnetic sheet is, for example, a sheet formed by dispersing a ferromagnetic substance in a synthetic resin, and may be a commercially available product sold under the name of, for example, noise suppression sheet.

The printed circuit board is not limited to a flexible printed circuit board, which has flexibility, and may be a rigid printed circuit board.

INDUSTRIAL APPLICABILITY

As has been described, a printed circuit board according to the present invention has a small size and enables efficient transmission and reception of electricity, so that it is suitably applicable to transmitting antennas, receiving antennas, and transformers for mobile devices.

REFERENCE SIGNS LIST 1 first insulating layer; 2 first conductive layer; 2a first circuit pattern; 3 second conductive layer; 3a second circuit pattern; 4 second insulating layer; 4a adhesive layer; 5 third conductive layer; 5a connection wiring pattern; 6 first coverlay; 7 second coverlay; 8 loop-forming through-hole; 9 first connection terminal; 10 second connection terminal; 11a first intermediate terminal; 11b second intermediate terminal; 11c third intermediate terminal; 12 terminal-connecting through-hole; 13 covering film; 14 adhesive layer; 15 opening

The invention claimed is:
1. A printed circuit board comprising: alternately,
at least one insulating layer containing a synthetic resin as a main component; and
a plurality of conductive layers including circuit patterns,
wherein the plurality of circuit patterns of the plurality of conductive layers form a spiral pattern in plan view, and
the plurality of circuit patterns are connected together via a plurality of through-holes so as to form a single closed loop in which a current flows counterclockwise or clockwise in an entirety of the spiral pattern,
wherein the conductive layers are formed on both surfaces of the at least one insulating layer so as to form a pair;
wherein the spiral pattern includes a plurality of multi-row circuits arranged to form multi-rows and a bridging circuit,
the multi-row circuits include a first multi-row circuit formed in a conductive layer on one of surfaces of the at least one insulating layer, and a second multi-row circuit formed in a conductive layer on another one of the surfaces of the at least one insulating layer and being adjacent to the first multi-row circuit, and
the bridging circuit connects an end portion of the first multi-row circuit to an end portion of the second multi-row circuit;
wherein the multi-row circuits are circular arc circuits that have different radii and are concentrically arranged so as to form multi-rows;
wherein, in 70% or more of a total length of the spiral pattern, the plurality of circuit patterns of the plurality of conductive layers overlap in plan view; and
wherein the bridging circuit includes a circuit extending from an end portion of the first multi-row circuit in a radial direction of the circular arc of the first multi-row circuit in plan view and connecting to the through-hole.

2. The printed circuit board according to claim 1, wherein the plurality of multi-row circuits have a length corresponding to less than one turn of the spiral pattern.

3. The printed circuit board according to claim 1, wherein, in 70% or more of a total length of the spiral pattern, a voltage difference between any one point of a circuit pattern of a conductive layer on one of surfaces of the at least one insulating layer and a point of a circuit pattern of a conductive layer on another one of the surfaces of the at least one insulating layer, the point being nearest to the one point, is 50% or less of a voltage drop of the entirety of the spiral pattern.

4. The printed circuit board according to claim 1, wherein the at least one insulating layer has flexibility.

5. An antenna comprising the printed circuit board according to claim 1.

6. A wireless charging device comprising a transmitter and a receiver,
wherein the transmitter and the receiver include the antenna according to claim 5.

* * * * *